United States Patent
Park et al.

(10) Patent No.: US 7,196,465 B2
(45) Date of Patent: Mar. 27, 2007

(54) DUAL PANEL TYPE ORGANIC ELECTROLUMINESCENT DEVICE AND METHOD FOR FABRICATING THE SAME

(75) Inventors: Jae Yong Park, Gyeonggi-do (KR); Choong Keun Yoo, Incheon-si (KR); Ock Hee Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 148 days.

(21) Appl. No.: 10/880,317

(22) Filed: Jun. 30, 2004

(65) Prior Publication Data

US 2005/0140290 A1    Jun. 30, 2005

(30) Foreign Application Priority Data

Dec. 30, 2003  (KR) .................. 10-2003-0099884
Dec. 30, 2003  (KR) .................. 10-2003-0100680

(51) Int. Cl.
*H01J 63/04*    (2006.01)
*H01J 1/62*     (2006.01)
*H01J 9/00*     (2006.01)
*H01J 9/24*     (2006.01)

(52) U.S. Cl. ............ 313/505; 313/504; 313/506; 313/512; 445/24; 445/25

(58) Field of Classification Search ............ 313/505
See application file for complete search history.

(56) References Cited

U.S. PATENT DOCUMENTS

| | | | | |
|---|---|---|---|---|
| 6,046,790 A * | 4/2000 | Hara et al. | .................. | 349/172 |
| 6,175,345 B1 * | 1/2001 | Kuribayashi et al. | ....... | 313/506 |
| 6,724,458 B2 * | 4/2004 | Kim et al. | .................. | 349/156 |
| 6,927,536 B2 * | 8/2005 | Kim et al. | .................. | 313/506 |
| 6,933,574 B2 * | 8/2005 | Park et al. | .................. | 313/505 |
| 2002/0158577 A1* | 10/2002 | Shimoda et al. | ........... | 313/506 |
| 2003/0201445 A1* | 10/2003 | Park et al. | .................... | 257/79 |
| 2004/0004432 A1 | 1/2004 | Park et al. | .................. | 313/504 |
| 2004/0135496 A1 | 7/2004 | Park et al. | .................. | 313/504 |
| 2006/0055313 A1* | 3/2006 | Bae et al. | .................... | 313/506 |

FOREIGN PATENT DOCUMENTS

GB   2396951   7/2004

(Continued)

*Primary Examiner*—Nimeshkumar D. Patel
*Assistant Examiner*—Natalie K. Walford
(74) *Attorney, Agent, or Firm*—Morgan, Lewis & Bockius LLP

(57) ABSTRACT

A dual panel type organic electroluminescent device includes a first substrate having a first region and a second region corresponding to a peripheral region of the first region, TFTs formed in the first region, pad parts formed in the second region, a second substrate attached to the first substrate with a predetermined space therebetween, the second substrate overlapping the first region and exposing the second region of the first substrate, a first electrode, an organic electroluminescent layer and a second electrode formed on the second substrate facing the first substrate, a first electrical connection pattern connecting the thin film transistor with the second electrode, a second electrical connection pattern connecting one of the pad parts with the first electrode, a seal pattern disposed on edges of the first and second substrates, and a dummy spacer disposed between an image display region of the first region and the seal pattern.

37 Claims, 7 Drawing Sheets

FOREIGN PATENT DOCUMENTS

| | | | |
|---|---|---|---|
| JP | 2001117509 A * | 4/2001 | |
| JP | 2004 191641 | 7/2004 | |
| KR | 2003-0079429 | 10/2003 | |
| KR | 2003-0086167 | 11/2003 | |
| WO | WO 2078101 A1 * | 10/2002 | |

* cited by examiner

DUAL PANEL TYPE ORGANIC ELECTROLUMINESCENT DEVICE AND METHOD FOR FABRICATING THE SAME

The present application claims the benefit of Korean Patent Application No. 099884/2003 filed in Korea on Dec. 30, 2003 and Korean Patent Application No. 100680/2003 filed in Korea on Dec. 30, 2003, which are hereby incorporated by reference.

BACKGROUND OF THE INVENTION

1. Field of the Invention

The present invention relates to an organic electroluminescent device and a method of fabricating the same, and more particularly, to a dual panel type organic electroluminescent device and method for fabricating the same that include an array device having a thin film transistor and an organic electroluminescent diode element formed on different substrates.

2. Discussion of the Related Art

In general, an organic electroluminescent device (ELD), which is a type of flat panel display, emits light by injecting electrons from a cathode and holes from an anode into an emission layer, combining the electrons with the holes, generating an exciton, and transitioning the exciton from an excited state to a ground state. Unlike a liquid crystal display (LCD) device, an additional light source is not necessary for the organic ELD to emit light. Accordingly, the organic ELD has a light weight, thin profile, compact size, wide viewing angle, and high image contrast. In addition, the organic ELD can operate using a DC low voltage, thereby having low power consumption and fast response time. Further, the organic ELD is an integrated device and it has high endurance of external impacts and a wide range of applications. Moreover, since fabricating an organic ELD is a relatively simple process, an organic ELD has a low production cost.

FIG. 1 is a schematic view of a unit pixel area of an organic electroluminescent device according to the related art. In FIG. 1, a scan line is formed along a first direction. A signal line and a power supply line are formed along a second direction perpendicular to the first direction and crossing the scan line, thereby defining a pixel area. A switching thin film transistor (TFT) Ts serving as an addressing element is formed at a crossing point of the scan line and the signal line, and connects to a storage capacitance $C_{ST}$. The switching TFT Ts controls voltage, and the storage capacitance $C_{ST}$ stores a current source.

In addition, a drive TFT $T_D$ serving as a current source element is connected between the switching TFT Ts and the storage capacitance $C_{ST}$. One terminal of the drive TFT $T_D$ is connected to the power supply line, and another terminal is connected to an anode (+) electrode. The anode electrode is connected with a cathode (−) electrode through an electroluminescent diode "E" operating in a static current driving method. The anode electrode and the cathode electrode connected by the electroluminescent diode "E" constitute an organic electroluminescent device.

As a signal is applied to a corresponding electrode according to a selection signal, the gate of the switching TFT Ts is turned on. Accordingly, a data signal passes through the gate of the switching TFT Ts and is applied to the drive TFT $T_D$ and the storage capacitance $C_{ST}$. As the gate of the drive TFT $T_D$ is turned on, a current is applied from the power supply line to the organic electroluminescent diode E through the gate of the drive TFT $T_D$, thereby emitting light. In addition, since an open degree of the drive TFT $T_D$ is varied based on the data signal, a desired gray scale can be displayed by controlling amount of current flowing through the drive TFT $T_D$. Further, during a non-selected period, data charged in the storage capacitance $C_{ST}$ is continuously applied to the drive TFT $T_D$, thereby allowing the organic electroluminescent device to emit light until a next image signal is applied.

FIGS. 2A to 2C are views illustrating an organic electroluminescent device according to the related art. Specifically, FIG. 2A is a plane view of a panel, FIG. 2B is a sectional view of the panel, and FIG. 2C is a sectional view taken along IIc—IIc of FIG. 2A.

As shown in FIG. 2A, a panel includes a substrate 10 having a first region IIa and a second region IIb enclosing the first region IIa. The first region IIa includes a first sub-region IIaa corresponding to an image display region, and a second sub-region IIab corresponding to a region between the image display region and a seal pattern. Although not shown, a plurality of gate lines, data lines, power supply lines and the like defining a plurality of pixel areas are formed within the first region IIa and an electroluminescent device is included in each of the pixel areas.

In addition, first, second, third and fourth array pads 20, 22, 24 and 26 are formed along four sides of the substrate 10. The first array pad 20 is a group of gate pads for applying a gate signal to the gate lines, the second array pad 22 is a group of data pads for applying a data signal to the data lines, the third array pad 24 is a group of power pads for applying a Vdd signal to the power supply lines, and the fourth array pad 26 is a ground pad to which a ground current is applied. Further, the fourth array pad 26 is a circle pattern and has a larger area than the first, second and third array pads, 20, 22, and 24, due to an electrical characteristic of a DC current applied to a common electrode array pad.

The first region IIa of the first substrate 10 is sealed by an encapsulation substrate 30 and is shielded from the exterior. The encapsulation substrate 30 is formed of a thin passivation film, a glass substrate, or a plastic substrate.

The sectional view of FIG. 2B is shown centering on the encapsulation structure, and omitting the pads. As shown in FIG. 2B, a seal pattern 32 for sealing the first region IIa of the first substrate 10 with the encapsulation substrate 30 is formed on a peripheral portion enclosing the first region IIa of the first substrate 10. The first region IIa includes a plurality of pixel areas "P" and TFTs "T" formed in the pixel areas "P." The first region IIa also includes a first electrode 12 connecting to the TFTs "T." The first electrode 12 includes a transparent electrode material. An organic electroluminescent layer 14 for emitting red (R), green (G) and blue (B) color lights is formed on the first electrode 12. A second electrode 16 is formed on an entire surface of the organic electroluminescent layer 14 and functions as a common electrode. The first and second electrodes 12 and 16, and the organic electroluminescent layer 14 interposed between the first and second electrodes 12 and 16 constitute an organic electroluminescent diode element "E," such that the organic electroluminescent layer 14 emits light toward the first electrode 12.

In FIG. 2C, the second electrode 16 receives current applied through one of the array pads, 20, 22, 24 and 26 (shown in FIG. 2A). For example, the second electrode 16 electrically connects to the fourth array pad 26 in the second sub-region IIab. In other words, one end of the second electrode 16 extends from the first sub-region IIaa into the second sub-region IIab, and one end of the fourth array pad 26 extends from the second region IIb into the second sub-region IIab.

Accordingly, the organic electroluminescent device according to the related art is fabricated by forming the array device and the organic electroluminescent diode element on a substrate and attaching the substrate to the encapsulation substrate and fabrication yields of the array device and the organic electroluminescent diode element determine an overall yield of the organic electroluminescent device. Thus, even if the array device is formed without defects but the organic electroluminescent diode element is formed with a defect, e.g., foreign particles in the organic electroluminescent layer, the organic electroluminescent device panel would be defective, thereby reducing fabrication yield and increasing fabrication costs increases.

In addition, the above-described organic electroluminescent device is classified as a lower luminescent way because its luminescence depends on the transparency of the electrode. Although the lower luminescent way device has high stability and process freedom due to the encapsulation, it has a small aperture ratio, thereby limiting its application in high resolution products.

The upper luminescent way device has an easy design, enhanced aperture ratio, and longer life span. However, in the related art upper luminescent way, since a cathode is generally disposed on an organic electroluminescent layer, specific materials are required and light transmissivity is limited, thereby lowering light efficiency. Also, when a thin passivation film is formed to minimize the lowering of light transmissivity, the related art upper luminescent way fails to sufficiently block exterior air.

SUMMARY OF THE INVENTION

Accordingly, the present invention is directed to a device and a method of fabricating the same that substantially obviate one or more of the problems due to limitations and disadvantages of the related art.

An object of the present invention is to provide a dual panel type organic electroluminescent device and a method for fabricating the same that include an array device having a thin film transistor and an organic electroluminescent diode element formed on different substrates.

Another object of the present invention is to provide a pattern structure and a method of fabricating the same that provide an electrical connection between an electrode of an organic electroluminescent device and a pad formed on an array substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the dual panel type organic electroluminescent device includes a first substrate having a first region and a second region corresponding to a peripheral region of the first region, a plurality of thin film transistors formed in the first region, a plurality of pad parts formed in the second region, a second substrate attached to the first substrate with a predetermined space therebetween, the second substrate overlapping the first region and exposing the second region of the first substrate, a first electrode, an organic electroluminescent layer and a second electrode formed on a surface of the second substrate facing the first substrate, a first electrical connection pattern connecting the thin film transistor with the second electrode, a second electrical connection pattern connecting one of the pad parts with the first electrode, a seal pattern disposed on edges of the first and second substrates, and a first dummy spacer disposed between an image display region of the first region and the seal pattern.

In another aspect, the method of fabricating a dual panel type organic electroluminescent device includes forming a plurality of thin film transistors and a plurality of pads on a first substrate having a first region and a second region surrounding the first region, the thin film transistors formed in the first region, and the pads formed in a second region, forming a first electrical connection pattern connecting to the thin film transistor on the first substrate, forming a plurality of dummy spacers in the first region, forming an organic electroluminescent diode element on a second substrate, and attaching the first substrate and the second substrate in a direction that the first electrical connection pattern and the dummy spacers of the first substrate face the organic electroluminescent diode element of the second substrate, wherein the organic electroluminescent diode element connects to the first electrical connection pattern, and a uniform cell gap between the first substrate and the second substrate is maintained by the dummy spacers.

In another aspect, the dual panel type organic electroluminescent device includes first and second substrates facing each other with a predetermined space therebetween, an image display region including a plurality of pixel areas arranged in a matrix, each of the pixel areas having a thin film transistor formed on an inner surface of the first substrate, and an organic electroluminescent diode element formed on an inner surface of the second substrate, a first electrical connection pattern disposed within each of the pixel areas of the image display region, connecting the thin film transistor with the organic electroluminescent diode element, a seal pattern formed on edges of the first and second substrates, a plurality of first dummy spacers formed in a region between the image display region and the seal pattern, and a plurality of second dummy spacers formed within the seal pattern.

In another aspect, the method of fabricating a dual panel type organic electroluminescent device includes forming an array device having a switching element in each of a plurality of sub-pixels on a first substrate, forming an electrical connection pattern connecting to the switching element, forming a first electrode of a transparent conductive material on a second substrate, sequentially forming an organic electroluminescent layer and a second electrode on the first electrode in regions corresponding to the sub-pixels, forming a seal pattern on an edge of one of the first and second substrates, forming first dummy spacers in a region in which the first and second substrates overlapping each other and peripheral to an image display region, forming second dummy spacers within the seal pattern, and attaching the first substrate and the second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
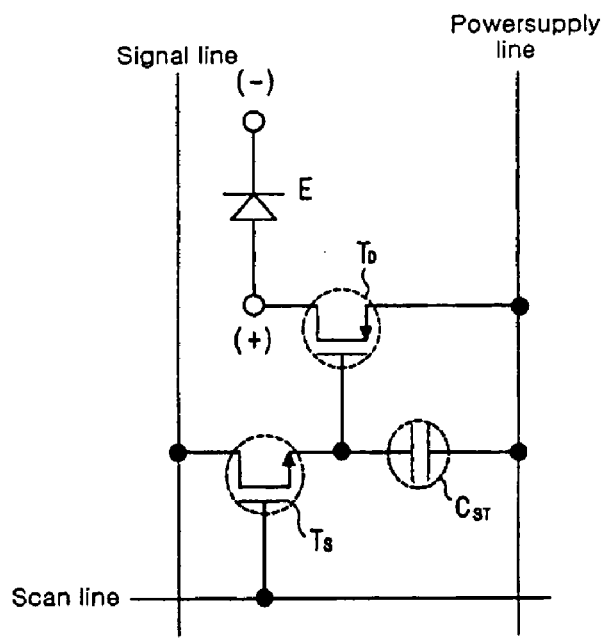
FIG. 1 is a schematic view of a unit pixel area of an organic electroluminescent device according to the related art.
Figure 2A:
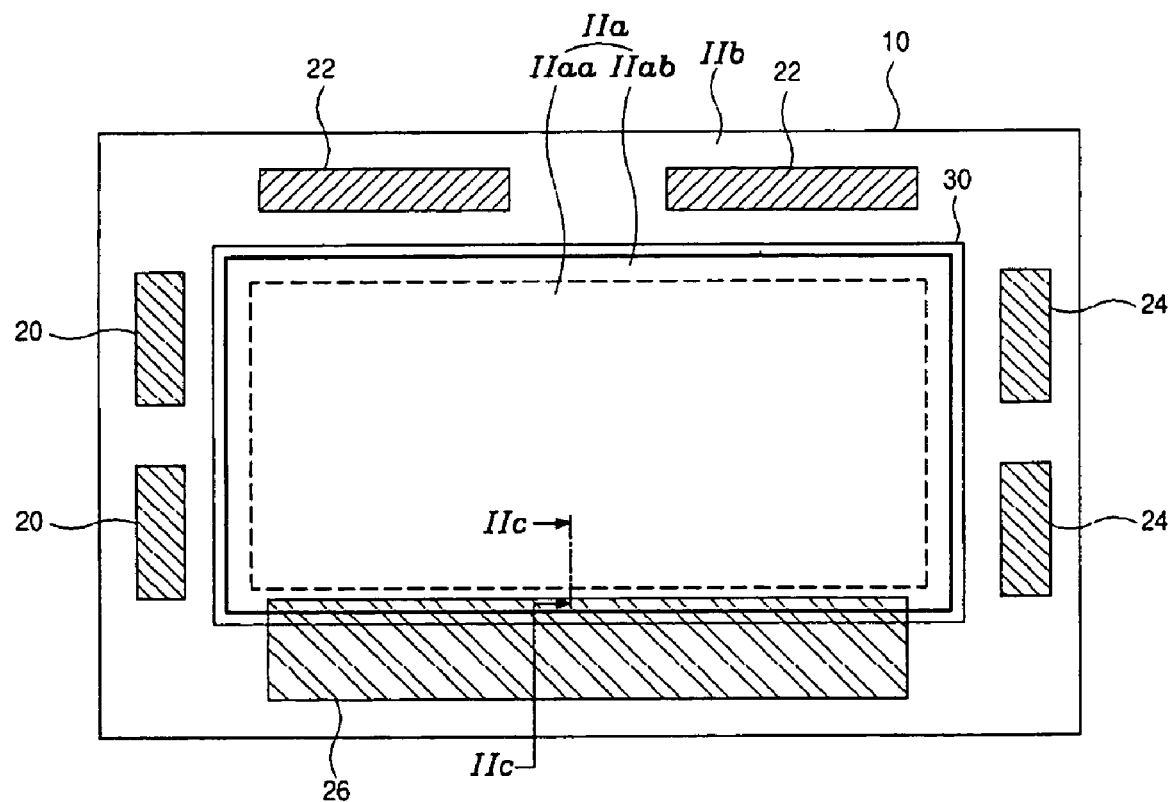
FIGS. 2A to 2C are views illustrating an organic electroluminescent device according to the related art.
Figure 2B:
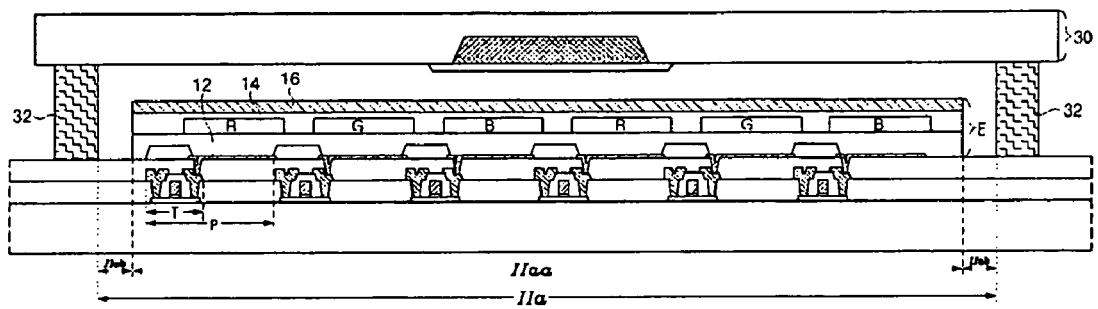
Figure 2C:
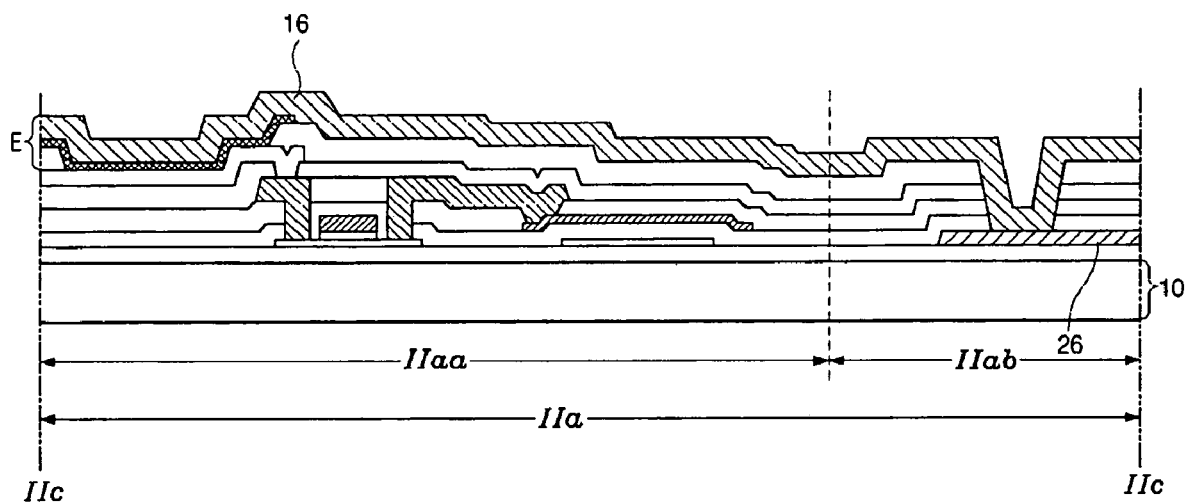
Figure 3:
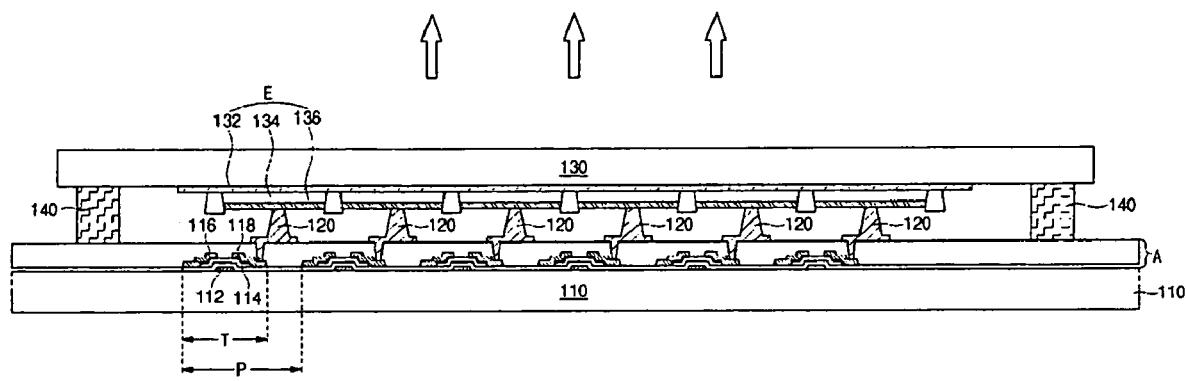
FIG. 3 is a sectional view of an encapsulated dual panel type organic electroluminescent device according to an embodiment of the present invention.

FIG. 3 is a sectional view of an encapsulated dual panel type organic electroluminescent device according to an embodiment of the present invention. In FIG. 3, an organic electroluminescent device may include a first substrate 110 and a second substrate 130 attached to each other by a seal pattern 140 with a predetermined space therebetween. The seal pattern 140 may be formed along edges of the first and second substrates 110 and 130.

An array device layer "A" including thin film transistors "T" and first electrical connection patterns 120 connected to the TFTs "T" may be formed on the first substrate 110. The first electrical connection patterns 120 may include a conductive material and may have a multi-layer structure including an insulating material to increase its thickness. The TFTs "T" may be inverted staggered type TFTs including amorphous silicon. Each of the TFTs "T" may include a gate electrode 112, a semiconductor layer 114, a source electrode 116, and a drain electrode 118. In addition, each of the first electrical connection patterns 120 may connect to the drain electrode 118, and the TFTs "T" connected to the first electrical connection patterns 120 may be drive thin film transistors.

A first electrode 132 may be formed on an entire inner surface of the second substrate 130. An organic electroluminescent layer 134 may be formed beneath the first electrode 132 and may include red-color, green-color and blue-color luminescent patterns (not shown) corresponding to pixel areas "P". A second electrode 136 may be formed in each of the pixel areas "P" beneath the organic electroluminescent layer 134. The first and second electrodes 132 and 136, and the organic electroluminescent layer 134 interposed between the first and second electrodes 132 and 136 may constitute an organic electroluminescent diode element "E."

An uppermost surface of the first electrical connection patterns 120 may contact a lower surface of the second electrode 136, and a supply current from the TFT "T" may be supplied to the second electrode 136 through the first electrical connection pattern 120. As a result, although the organic electroluminescent diode element "E" and the array device layer "A" are formed on different substrates in the dual panel type device, the organic electroluminescent diode element "E" and the array device layer "A" still may be electrically connected. Accordingly, the dual panel type organic electroluminescent device of the above-described embodiment employs the upper luminescent way and has an upward luminescent direction ⇧, easy design, high aperture ratio and high resolution.

Figure 4A:
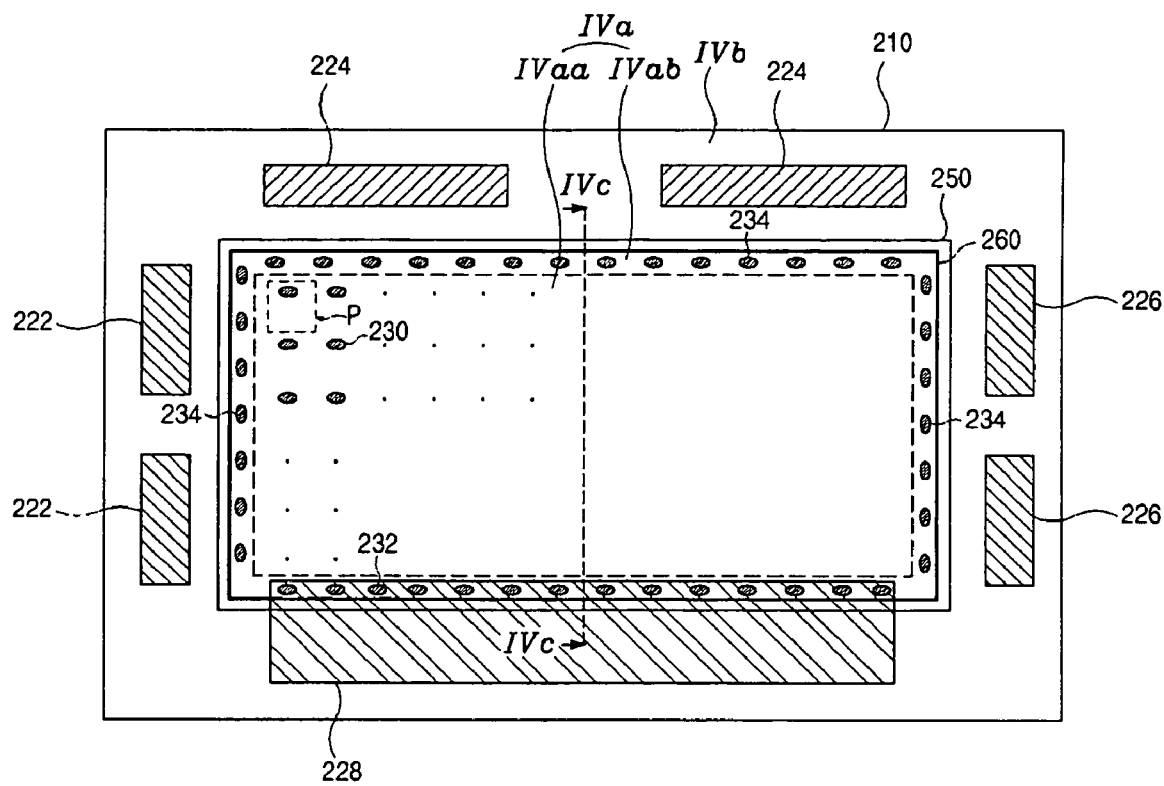
FIG. 4A is a plane view of a panel according to another embodiment of the present invention.
Figure 4B:
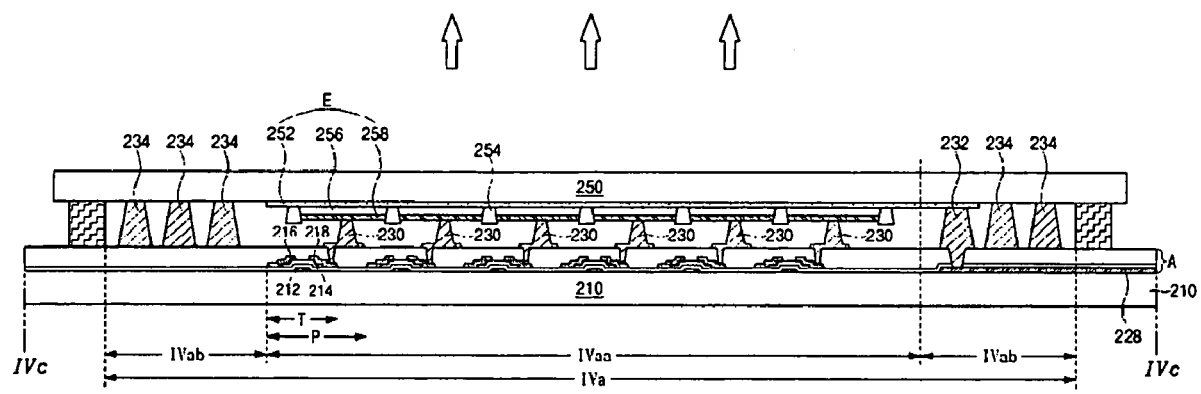
FIG. 4B is a sectional view of the panel of FIG. 4A along IVc—IVc.

FIG. 4A is a plane view of a panel according to an embodiment of the present invention, and FIG. 4B is a sectional view of the panel of FIG. 4A along IVc—IVc. In FIG. 4A, an organic electroluminescent device may include a first substrate 210 and a second substrate 250 attached facing each other by a seal pattern 260. The seal pattern 260 may be formed at edges of the first substrate 210 and the second substrate 250 overlapping with each other. The first substrate 210 may have a first region IVa and a second region IVb enclosing the first region IVa, and a second substrate 250 may expose the second region IVb and overlap the first region IVa. In addition, the first region IVa may include a first sub-region IVaa corresponding an image display region and a second sub-region IVab corresponding to a spacing region between the first sub-region IVaa and the seal pattern 260.

A plurality of pixel areas "P" may be formed in the first sub-region IVaa. In the first sub-region IVaa, first electrical connection patterns 230 for electrically connecting the first substrate 210 and the second substrate 250 may be formed.

In addition, first, second, third and fourth pads, 222, 224, 226, and 228, may be formed in the second region IVb along four sides of the first substrate 210. The fourth pad 228 may extend to the second sub-region IVab and the fourth pad 228 may electrically connect to the second substrate 250.

Further, a plurality of second electrical connection patterns 232 may be formed in an overlapping region between the fourth pad 228 and the second substrate 250 and the second electrical connection patterns 232 may electrically connect the fourth pad 228 and the second substrate 250. Dummy spacers 234 may be formed in the second sub-region IVab for maintaining a uniform cell gap. The plurality of second electrical connection patterns 232 and the dummy spacers 234 may be formed in a matrix arrangement.

As shown in FIG. 4B, the first and second substrates 210 and 250 may be disposed facing each other. An array device layer A including a plurality of TFTs "T" may be formed on the first substrate 210. Each of the TFTs "T" may include a gate electrode 212, a semiconductor layer 214, a source electrode 216 and a drain electrode 218. The first electrical connection patterns 230 may connect to the drain electrodes 218 of the TFT "T" formed in the corresponding pixel area "P." In addition, the first and second electrical connection patterns 230 and 232 may be formed of a same material and may be formed at a same process.

A first electrode 252 may be formed on an inner surface of the second substrate 250. The first electrode 252 may be formed within the first sub-region IVaa and may have an end extending to the second sub-region IVab. The first electrode 252 may function as a common electrode. An organic electroluminescent layer 256 and a second electrode 258 may be sequentially stacked between a plurality of barrier ribs 254 formed at boundary of the pixel areas "P" beneath the first electrode 252. The first and second electrodes 252 and 258, and the organic electroluminescent layer 256 interposed between the first and second electrodes 252 and 258 may constitute an organic electroluminescent diode element "E." The second electrode 258 may contact the first electrical connection patterns 230. In addition, the first electrode 252 may electrically connect to the fourth pad 228 through the second electrical connection pattern 232 in the second sub-region IVab. Further, the dummy spacers 234 may be formed in the second sub-region IVab for maintaining a uniform cell gap between the first and second substrates 210 and 250.

Accordingly, the dual panel type organic electroluminescent device of the above-described embodiment employs the upper luminescent way and has an upward luminescent direction ↑, easy design, high aperture ratio and high resolution. In addition, the dummy spacers formed between the first and second substrates 210 and 250 may provide structural support and may prevent the first and second substrates 210 and 250 from curving.

Figure 5A:
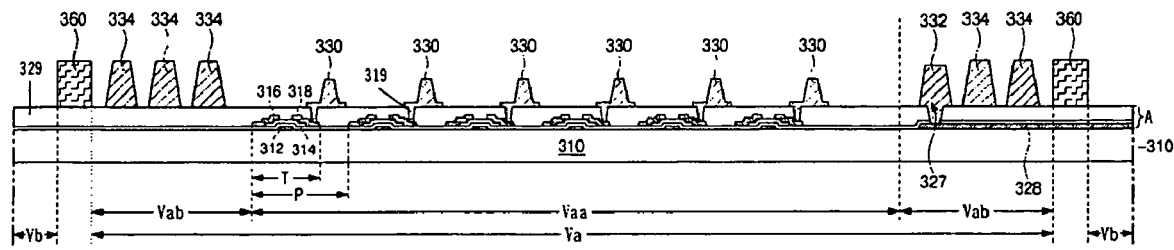
FIGS. 5A to 5C are views illustrating a method of fabricating an organic electroluminescent device according to yet another embodiment of the present invention.
Figure 5B:
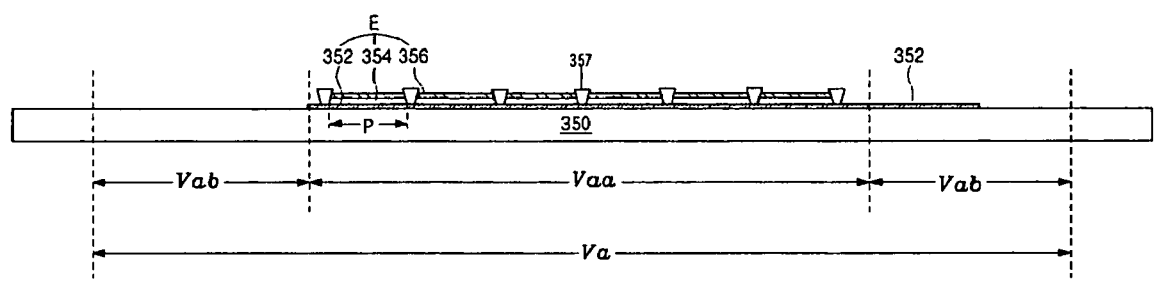
Figure 5C:
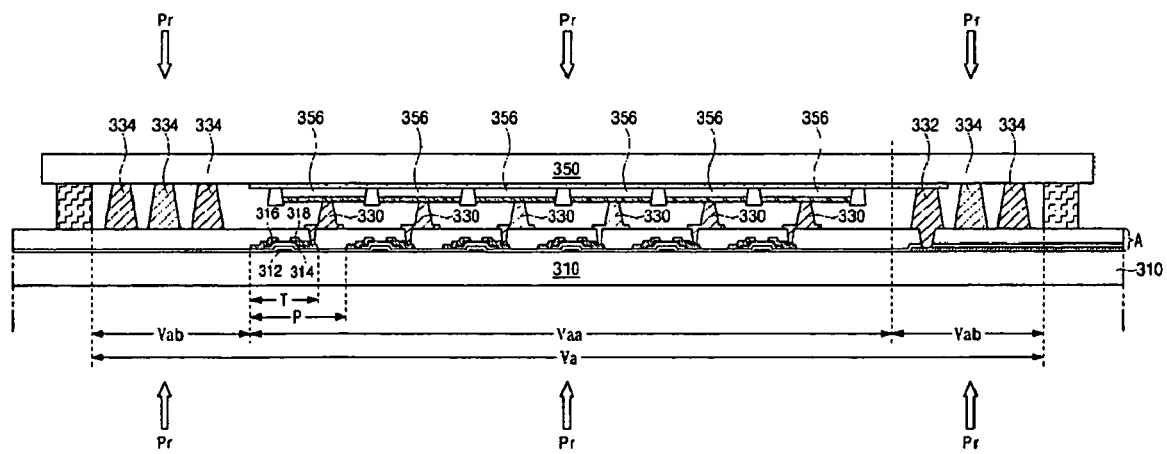

FIGS. 5A to 5C are views illustrating a method of fabricating an organic electroluminescent device according to yet another embodiment of the present invention. As shown in FIG. 5A, a method of fabricating an organic electroluminescent device may include forming an array device layer "A" on a first substrate 310. Forming the array device layer "A" may include forming a plurality of TFTs "T," scan lines, signal lines, and power supply lines (not shown) in a first sub-region Vaa of a first region Va. Each of the TFTs "T" may be formed in each of pixel areas "P" and may include a gate electrode 312, a semiconductor layer 314, a source electrode 316 and a drain electrode 318. In addition, array pads 328 may be formed in a second sub-region Vab of the first region Va and in a second region Vb. The second region Vb may enclose the first region Va. The first sub-region Vaa may correspond to an image display region, and the second sub-region Vab may correspond to a spacing region between the image display region and a seal pattern region. Although not shown in detail, the array pad 328 may include four array pads disposed along four sides of the second region Vb.

An insulating layer 329 having first and second contact holes 319 and 327 partially exposing the drain electrode 318 and the array pad 328, respectively, may be formed covering the TFTs "T" and the array pad 328. Then, a first electrical connection pattern 330 may be formed on the insulating layer 329 and may contact the drain electrode 318 via the first contact holes 319. In addition, a second electrical connection pattern 332 may be formed on the insulating layer 329 and may contact the array pad via the second contact hole 327. Further, a plurality of dummy spacers 334 may be formed on the insulating layer 329 in the second sub-region Vab.

The first and second electrical connection patterns 330 and 332, and the dummy spacers 334 may be formed of a same material and may be formed in a same process step. Alternatively, when the dummy spacers 334 are formed of an insulating material, the first and second electrical connection patterns 330 and 332 may be formed of an insulating material and a metal material. Further, a seal pattern 360 may be formed enclosing the first region Va and formed in a region between the second region Vb and the second sub-region Vab.

In addition, a height of the second electrical connection pattern 332 may be larger than a height of the first electrical connection pattern 330 and may be smaller than a height of the dummy spacers 334 to maintain a uniform cell gap. Thus, the heights of the first electrical connection pattern 330, the second electrical connection pattern 332, and the dummy spacers 334 may be adjusted. Further, the first electrical connection pattern 330, the second electrical connection pattern 332, and the dummy spacers 334 may have a tapered shape with a bottom width greater than a top width. Thus, the widths of the first electrical connection pattern 330, the second electrical connection pattern 332, and the dummy spacers 334 may be adjusted.

As shown in FIG. 5B, the method of fabricating an organic electroluminescent device also may include forming an organic electroluminescent diode element "E" on a second substrate 350. Forming the organic electroluminescent diode element "E" may include forming a first electrode 352, an organic electroluminescent layer 354, and a second electrode 356. The second substrate 350 may include first region Va, first sub-region Vaa, and second sub-region Vab corresponding to the first substrate 310 (shown in FIG. 5A). In addition, the first electrode 352 may be formed in the first sub-region Vaa and one end of the first electrode 352 may extend into the second sub-region Vab. The first electrode 352 may function as a common electrode. Further, the organic electroluminescent layer 354 and the second electrode 356 may be formed in the first sub-region Vaa. The organic electroluminescent layer 354 and the second electrode 356 also may be patterned at boundaries of each of the pixel areas "P" and may be divided by a plurality of barrier ribs 357.

As shown in FIG. 5C, the method of fabricating an organic electroluminescent device further may include encapsulating the first and second substrates 310 and 350 formed as shown in FIGS. 5A and 5B using the seal pattern 360 as an adhesive. Encapsulating the first and second substrates 310 and 350 may include arranging the first and second substrates 310 and 350 facing each other, aligning the first and second substrates, and applying pressure Pr. As a result, the first electrical connection pattern 330 formed on the first substrate 310 may contact the second electrode 356, and the second electrical connection pattern 332 may contact the first electrode 310. In addition, the cell gap between the first sub-region Vaa and the second sub-region Vab may be maintained by the dummy spacers 334, thereby preventing the first and second substrates 310 and 350 from being curved due to the application of the pressure Pr.

Figure 6:
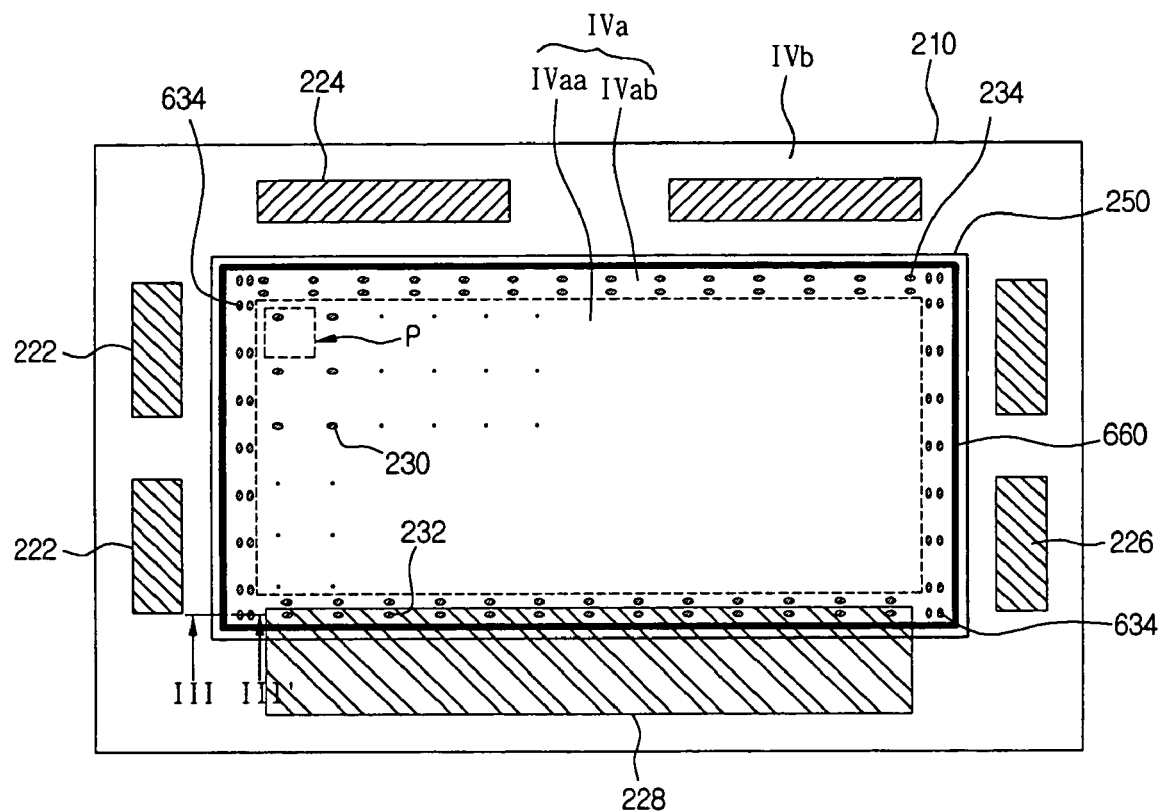
FIG. 6 is a plane view of a dual panel type organic electroluminescent device according to another embodiment of the present invention.

FIG. 6 is a plane view of a dual panel type organic electroluminescent device according to another embodiment of the present invention. As shown in FIG. 6, an organic electroluminescent device may include a first substrate 210 and a second substrate 250 attached and facing each other by a seal pattern 660. The seal pattern 660 may be formed at edges of the first substrate 210 and the second substrate 250 overlapping with each other. The first substrate 210 may have a first region IVa and a second region IVb enclosing the first region IVa, and a second substrate 250 may expose the second region IVb and overlap the first region IVa. In addition, the first region IVa may include a first sub-region IVaa corresponding to an image display region and a second sub-region IVab corresponding to a spacing region between the first sub-region IVaa and the seal pattern 660.

A plurality of pixel areas "P" may be formed in the first sub-region IVaa. In the first sub-region IVaa, first electrical connection patterns 230 for electrically connecting the first substrate 210 and the second substrate 250 may be formed. In addition, first, second, third and fourth pads, 222, 224, 226, and 228, may be formed in the second region IVb along four sides of the first substrate 210. The fourth pad 228 may extend to the second sub-region IVab and the fourth pad 228 may electrically connect to the second substrate 250. Further, a plurality of second electrical connection patterns 232 may be formed in an overlapping region between the fourth pad 228 and the second substrate 250 and the second electrical connection patterns 232 may electrically connect the fourth pad 228 and the second substrate 250.

Moreover, a plurality of first dummy spacers 634 may be formed on a region between the first sub-region IVaa and the seal pattern 660. Also, a plurality of second dummy spacers 635 (shown in FIG. 7) may be formed within the seal pattern 660. The first and second dummy spacers may be arranged in an aligned pattern or in a zigzag pattern.

Figure 7:
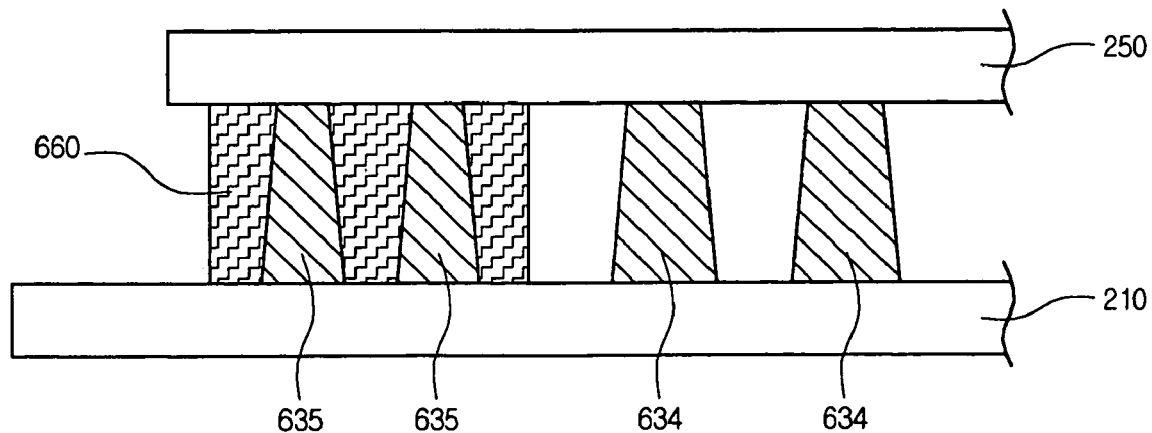
FIG. 7 is a sectional view taken along III–III' of FIG. 6.

FIG. 7 is a sectional view taken along III–III' of FIG. 6. As shown in FIG. 7, the second dummy spacers 635 and the seal pattern 660 may be formed interposed with each other. Since the second dummy spacers 635 are formed within the seal pattern 660, the seal pattern 660 may not contain fiber glass therein. The density of the second dummy spacers 635 may be higher than the density of the first dummy spacers 634. In other words, the second dummy spacers 635 formed within the seal pattern 660 may be formed more densely than the first dummy spacers 634 formed on the region between the first sub-region IVaa and the seal pattern 660. In addition, the second dummy spacers 635 may be formed less densely than the first electrical connection patterns 230 formed within the first sub-region IVaa.

In addition, the second dummy spacers 635 may effectively block moisture. The second dummy spacers 635 also may be a more effective reinforcing member than the fiber glass of the related art. Thus, by forming the dummy spacers 634 and 635, a uniform spacing between the first substrate 210 and the second substrate 250 may be maintained, especially in the first sub-region IVaa. As a result, unlike the related art, as a size of the organic electroluminescent device panel of the present invention increases, display quality would not deteriorate.

Figure 8:
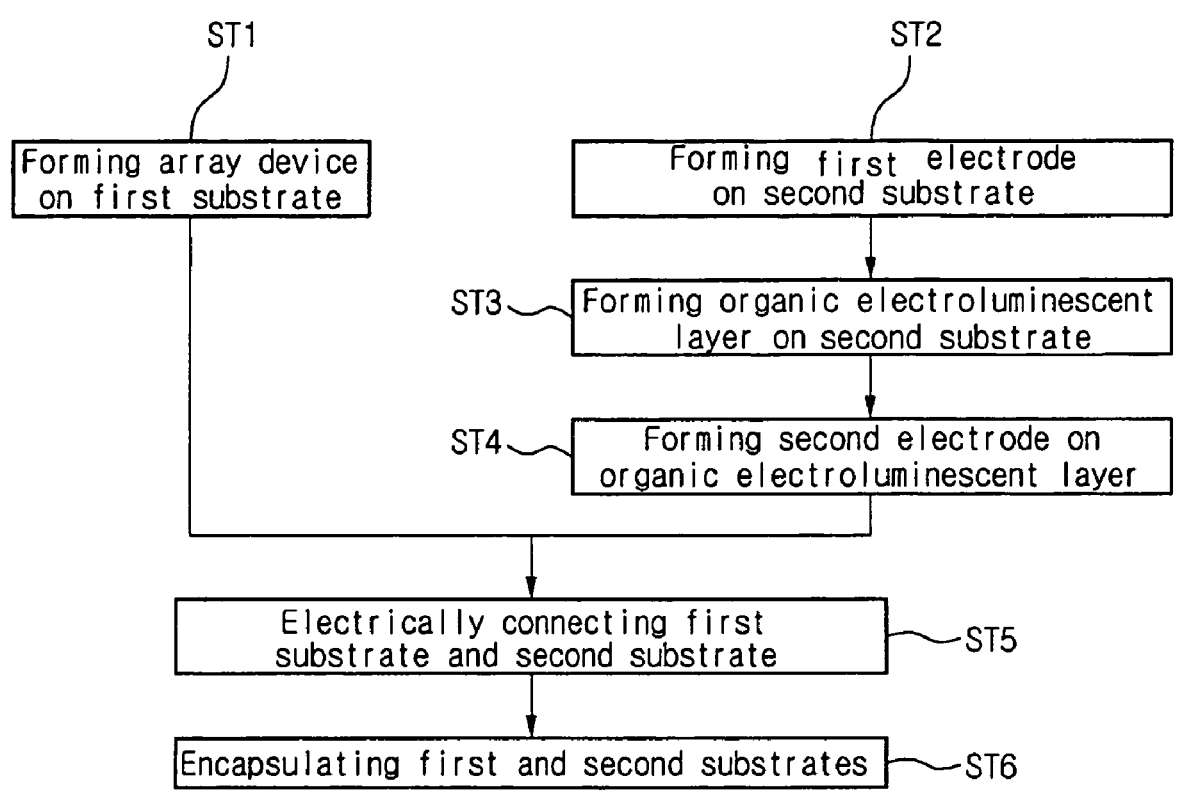
FIG. 8 is a flow diagram illustrating a method of fabricating an organic electroluminescent device according to another embodiment of the present invention.

FIG. 8 is a flow diagram illustrating a method of fabricating an organic electroluminescent device according to another embodiment of the present invention. As shown in FIG. 8, at step ST1, an array device may be formed on a first substrate, e.g., the first substrate 210 shown in FIGS. 4A, 4B and 6. The step ST1 may include forming a buffer layer on a transparent substrate, forming a semiconductor layer and a capacitor electrode on the buffer layer, forming a gate electrode, a source electrode and a drain electrode on the semiconductor layer, and forming a power electrode connected with the source electrode on the capacitor electrode. The array device may be formed in a matrix configuration within an image display region.

In addition, the step ST1 may include forming first and second electrical connection patterns, a seal pattern, and dummy spacers. For example, the first and second electrical connection patterns 230 and 232 (shown in FIGS. 4A, 4B and 6), first and second dummy spacers 634 and 635 (shown in FIG. 6), and a seal pattern 660 (shown in FIG. 6) may be formed. More specifically, the first dummy spacers 634 may be formed on a region between the image display region and the seal pattern 660, and the second dummy spacers 635 may be formed within the seal pattern 660.

At step ST2, a first electrode may be formed on a second substrate, e.g., the second substrate 250 shown in FIGS. 4A, 4B and 6. In the present invention, since the first electrode for an organic electroluminescent diode is formed directly on the transparent second substrate, more materials become available for forming the first electrode and processes can be performed more easily. For example, the first electrode may be selected from the group consisting of conductive materials having the transmissivity.

At step ST3, an organic electroluminescent layer may be formed on the first electrode. The organic electroluminescent layer may be made of a luminescent material exhibiting red, green and blue colors, and a low polymer or a high polymer, which injects or transfers electrons or holes. At step ST4, a second electrode may be formed on the organic electroluminescent layer.

At step ST5, after steps ST1–ST4, the first and second substrates may be electrically connected, e.g., using the first and second electrical connection patterns 230 and 232 shown in FIGS. 4A, 4B and 6. Specifically, the drive TFT formed on the first substrate may be electrically connected to the organic electroluminescent diode formed on the second substrate.

At ST6, the first and second substrates may be encapsulated. In other words, the first and second substrates 210 and 250 may be attached to each other using the seal pattern 260 shown in FIGS. 4A and 4B or the seal pattern 660 shown in FIG. 6. The step ST6 further may include forming a space between the first and second substrates in a nitrogen atmosphere. Since attaching the array substrate and the organic electroluminescent diode substrate may be performed after a test of each of the two substrates is completed, panel product failure can be reduced and efficiency of production management can be enhanced.

It will be apparent to those skilled in the art that various modifications and variations can be made in the present invention. For instance, although the embodiments of the present invention show and describe the TFT structure using amorphous silicon, it will be apparent that a TFT structure using polysilicon can be employed.

As described above, the dual panel type organic electroluminescent device and the fabrication method thereof according to the present invention has the following effects:

First, since the array device and the organic electroluminescent device are formed on different substrates, production yield and efficiency of production management increases and the life span of product also increases. Second, since the organic electroluminescent device operates in an upper luminescent way, design of a TFT is easy and a high aperture ratio/high resolution is achieved.

Third, the cell gap between the substrates is maintained uniformly and the organic electroluminescent diode element may be electrically connected to the array pad with ease. Fourth, by employing dummy spacers, curving of the substrates in the image display part and the seal pattern part is prevented.

It will be apparent to those skilled in the art that various modifications and variations can be made in the dual panel type organic electroluminescent device and method for fabricating the same of the present invention without departing from the sprit or scope of the invention. Thus, it is intended that the present invention covers the modifications and variations of this invention provided they come within the scope of the appended claims and their equivalents.

What is claimed is:

1. A dual panel type organic electroluminescent device, comprising:
    a first substrate having a first region and a second region corresponding to a peripheral region of the first region;
    a plurality of thin film transistors formed in the first region;
    a plurality of pad parts formed in the second region;

a second substrate attached to the first substrate with a predetermined space therebetween, the second substrate overlapping the first region and exposing the second region of the first substrate;

a first electrode, an organic electroluminescent layer and a second electrode formed on a surface of the second substrate facing the first substrate;

a first electrical connection pattern connecting the thin film transistor with the second electrode;

a second electrical connection pattern connecting one of the pad parts with the first electrode;

a seal pattern disposed on edges of the first and second substrates; and a first dummy spacer disposed between an image display region of the first region and the seal pattern, and extending from the first substrate to contact the second substrate.

2. The dual panel type organic electroluminescent device according to claim 1, wherein the first and second electrical connection patterns include a same material.

3. The dual panel type organic electroluminescent device according to claim 1, wherein the first electrical connection pattern, the second electrical connection pattern, and the first dummy spacer include a same material.

4. The dual panel type organic electroluminescent device according to claim 1, wherein the first and second electrical connection patterns are formed in a same process.

5. The dual panel type organic electroluminescent device according to claim 1, wherein the first electrical connection pattern, the second electrical connection pattern, and the first dummy spacer are formed in a same process.

6. The dual panel type organic electroluminescent device according to claim 1, wherein the first region comprises a first sub-region corresponding to the image display region, and a second sub-region corresponding to a region between the image display region and a region in which the seal pattern is formed, the second electrical connection pattern and the first dummy spacer are formed in the second sub-region.

7. The dual panel type organic electroluminescent device according to claim 6, wherein the first electrode is formed in the first sub-region and one end of the first electrode extends in the second sub-region, the first electrode connecting to the second electrical connection pattern in the second sub-region.

8. The dual panel type organic electroluminescent device according to claim 6, further comprising:

a second dummy spacer formed in the second region.

9. The dual type organic electroluminescent device according to claim 8, wherein the second dummy spacer is formed within a material of the seal pattern, the second dummy spacer and the seal pattern interposing each other.

10. The dual panel type organic electroluminescent device according to claim 1, further comprising:

a gate line formed on the first substrate along a first direction; and a data line and a power line formed on the first substrate along a second direction crossing the gate line, the second direction being substantially perpendicular to the first direction, wherein the thin film transistor includes a switching thin film transistor formed at a crossing point of the gate line and the data line, and a drive thin film transistor formed at a crossing point of the gate line and the data line and connected with the second electrode.

11. The dual panel type organic electroluminescent device according to claim 10, wherein the second region includes four sides, and the pad parts includes first, second, third and fourth pads along the four sides, respectively.

12. The dual panel type organic electroluminescent device according to claim 11, wherein the first pad connects to the gate line, the second pad connects to the data line, the third pad connects to the power line, and the fourth pad receives a ground current.

13. The dual panel type organic electroluminescent device according to claim 1, wherein one of the pad parts connecting to the second electrical connection extends into the first region to contact the second electrical connection pattern and to electrically connect to the first electrode via the second electrical connection pattern.

14. A method of fabricating a dual panel type organic electroluminescent device, comprising:

forming a plurality of thin film transistors and a plurality of pads on a first substrate having a first region and a second region surrounding the first region, the thin film transistors formed in the first region, and the pads formed in the second region;

forming a first electrical connection pattern connecting to the thin film transistor on the first substrate;

forming a plurality of dummy spacers in the first region, each of the dummy spacers extending from the first substrate to contact a second substrate;

forming an organic electroluminescent diode element on the second substrate; and attaching the first substrate and the second substrate in a direction that the first electrical connection pattern and the dummy spacers of the first substrate face the organic electroluminescent diode element of the second substrate, wherein the organic electroluminescent diode element connects to the first electrical connection pattern, and a uniform cell gap between the first substrate and the second substrate is maintained by the dummy spacers.

15. The method according to claim 14, prior to attaching the first substrate and the second substrate, further comprising forming a seal pattern on one of the first and second substrates at a position corresponding to a boundary between the first and second regions.

16. The method according to claim 14, further comprising forming a second electrical connection pattern connected to one of the pads.

17. The method according to claim 16, wherein the steps of forming the first electrical connection pattern, forming the dummy spacers, and forming the second electrical connection pattern include a same process.

18. The method according to claim 16, wherein the first region of the first substrate includes a first sub-region corresponding to an image display region, and a second sub-region, the first electrical connection pattern is formed in the first sub-region, the second electrical connection pattern in formed in the second sub-region and the dummy spacers are formed in the second sub-region.

19. The method according to claim 14, wherein in maintaining the cell gap using the dummy spacers, the dummy spacers maintain the cell gap of a region other than the second electrical connection pattern.

20. The method according to claim 14, wherein the step of attaching the first and second substrates includes aligning the first and second substrates such that the second substrate overlaps the first region of the first substrate and exposes the second region of the first substrate.

21. The method according to claim 14, wherein the first region of the first substrate includes a first sub-region corresponding to an image display region, and a second sub-region, the organic electroluminescent diode element is formed in a region of the second substrate corresponding to the first sub-region, and the dummy spacers are formed in the second sub-region.

22. The method according to claim 14, wherein the step of forming the organic electroluminescent diode element includes forming a first electrode, an organic electroluminescent layer, and a second electrode sequentially on the second substrate.

23. The method according to claim 22, wherein the step of attaching the first substrate and the second substrate includes connecting the first electrical connection pattern with the second electrode.

24. The method according to claim 22, further comprising forming a second electrical connection pattern in the first region on the first substrate, wherein the step of attaching the first and second substrates includes connecting the second electrical connection pattern with the first electrode.

25. The method according to claim 22, wherein the step of forming the pads includes forming one of the pads extending into the first region.

26. The method according to claim 25, further comprising forming a second electrical connection pattern in the first region connecting to the pad extending into the first region, wherein the step of attaching the first and second substrates includes connecting the first electrode with the pad extending into the first region via the second electrical connection pattern.

27. The method according to claim 14, further comprising:
forming a gate line on the first substrate along a first direction; and forming a data line and a power line on the first substrate along a second direction crossing the gate line, the second direction being substantially perpendicular to the first direction, wherein the step of forming the thin film transistor includes forming a switching thin film transistor at a crossing point of the gate line and the data line, and forming a drive thin film transistor at a crossing point of the gate line and the data line.

28. The method according to claim 27, wherein the step of forming the gate line and the step of forming the pads include a same process.

29. A dual panel type organic electroluminescent device, comprising:
first and second substrates facing each other with a predetermined space therebetween;
an image display region including a plurality of pixel areas arranged in a matrix, each of the pixel areas having a thin film transistor formed on an inner surface of the first substrate, and an organic electroluminescent diode element formed on an inner surface of the second substrate;
a first electrical connection pattern disposed within each of the pixel areas of the image display region, connecting the thin film transistor with the organic electroluminescent diode element;
a seal pattern formed on edges of the first and second substrates;
a plurality of first dummy spacers formed in a region between the image display region and the seal pattern; and
a plurality of second dummy spacers formed within a material of the seal pattern.

30. The dual panel type organic electroluminescent device according to claim 29, wherein the first and second dummy spacers are formed with different densities.

31. The dual panel type organic electroluminescent device according to claim 30, wherein the second dummy spacers are formed more densely than the first dummy spacers.

32. The dual panel type organic electroluminescent device according to claim 29, wherein the first electrical connection pattern is formed more densely than the first and second dummy spacers.

33. The dual panel type organic electroluminescent device according to claim 29, wherein the material of the seal pattern is made of a sealant material not containing glass fiber.

34. A method of fabricating a dual panel type organic electroluminescent device, comprising:
forming an array device having a switching element in each of a plurality of sub-pixels on a first substrate;
forming an electrical connection pattern connecting to the switching element;
forming a first electrode of a transparent conductive material on a second substrate;
sequentially forming an organic electroluminescent layer and a second electrode on the first electrode in regions corresponding to the sub-pixels;
forming a seal pattern on an edge of one of the first and second substrates;
forming first dummy spacers in a region in which the first and second substrates overlapping each other and peripheral to an image display region;
forming second dummy spacers within a material of the seal pattern; and
attaching the first substrate and the second substrate.

35. The method according to claim 34, wherein the first and second dummy spacers are formed with different densities.

36. The method according to claim 35, wherein the second dummy spacers are formed more densely than the first dummy spacers.

37. The method according to claim 34, wherein the seal pattern is made of a sealant material not containing glass fiber.

* * * * *